United States Patent
Chang et al.

(10) Patent No.: US 12,388,453 B2
(45) Date of Patent: Aug. 12, 2025

(54) DATA CONVERTER WITH OFFSET TONE REDUCTION

(71) Applicant: Apple Inc., Cupertino, CA (US)

(72) Inventors: Albert Hsu Ting Chang, Cambridge, MA (US); Ahmad Al Marashli, Munich (DE); George P. Reitsma, Cupertino, CA (US); Sudharsan Kanagaraj, Cupertino, CA (US); Hamid Nejati, Cupertino, CA (US); Dusan Stepanovic, Cupertino, CA (US); Vahid Majidzadeh Bafar, Cupertino, CA (US); Mansour Keramat, Cupertino, CA (US); Mahdi Khoshgard, Cupertino, CA (US)

(73) Assignee: APPLE INC., Cupertino, CA (US)

(*) Notice: Subject to any disclaimer, the term of this patent is extended or adjusted under 35 U.S.C. 154(b) by 59 days.

(21) Appl. No.: 18/122,523

(22) Filed: Mar. 16, 2023

(65) Prior Publication Data

US 2024/0313793 A1    Sep. 19, 2024

(51) Int. Cl.
| | | |
|---|---|---|
| *H03M 1/06* | (2006.01) | |
| *H03M 1/00* | (2006.01) | |
| *H03M 1/10* | (2006.01) | |
| *H03M 1/12* | (2006.01) | |
| *H03M 1/46* | (2006.01) | |

(52) U.S. Cl.
CPC ........... *H03M 1/0607* (2013.01); *H03M 1/00* (2013.01); *H03M 1/10* (2013.01); *H03M 1/1028* (2013.01); *H03M 1/12* (2013.01); *H03M 1/46* (2013.01)

(58) Field of Classification Search
CPC ........ H03M 1/0607; H03M 1/12; H03M 1/10; H03M 1/1028; H03M 1/00; H03M 1/46
See application file for complete search history.

(56) References Cited

U.S. PATENT DOCUMENTS

| | | | |
|---|---|---|---|
| 8,269,657 B2 | 9/2012 | Anthony et al. | |
| 8,947,284 B2 | 2/2015 | Ishii et al. | |
| 10,291,247 B1 | 5/2019 | Verbruggen et al. | |
| 10,530,379 B1 * | 1/2020 | Vaz | H03M 1/1215 |
| 2003/0227402 A1 * | 12/2003 | Starzyk | H03M 1/0653 |
| | | | 341/144 |

FOREIGN PATENT DOCUMENTS

CN            205179022      *  4/2016    ........... H03M 1/12

* cited by examiner

*Primary Examiner* — Joseph J Lauture
(74) *Attorney, Agent, or Firm* — Sterne, Kessler, Goldstein & Fox P.L.L.C.

(57) ABSTRACT

The present disclosure describes a system with an antenna, a signal generator, data converters, and an aggregator circuit. The antenna is configured to provide an input signal to the data converters. The signal generator is configured to generate a random binary sequence received by the data converters. The data converters include an analog circuit and a digital circuit configured to sample positive and negative polarities of the input signal based on the random binary sequence, reducing an offset tone in an output spectrum produced by the aggregator circuit.

20 Claims, 9 Drawing Sheets

DATA CONVERTER WITH OFFSET TONE REDUCTION

FIELD

This disclosure relates to a data converter and, more particularly, to an interleaved analog-to-digital converter (ADC) circuit with offset tone reduction.

BACKGROUND

Data converters, such as analog-to-digital converter (ADC) circuits, can require higher sampling rates to accommodate high bandwidth wireless and wireline communication systems. The high sampling rate requirement can be performed by multiple ADC circuits operating in an interleaved manner to optimize energy-speed tradeoffs and to reduce sensitivity of the overall ADC circuit to metastability. Offset mismatches among the multiple ADC circuits can however create undesirable spurs in the output spectrum of the interleaved ADC circuit.

SUMMARY

Embodiments of the present disclosure include a circuit having a signal generator and an analog-to-digital converter (ADC) circuit. The signal generator is configured to generate a random binary sequence. The ADC circuit is configured to receive an input signal and includes a first sampling switch and a second sampling switch. The first sampling switch is configured to sample a positive polarity of the input signal based on the random binary sequence and the second sampling switch is configured to sample the negative polarity of the input signal based on the random binary sequence.

Embodiments of the present disclosure include a system with a signal generator, data converters, and an aggregator circuit. The signal generator is configured to generate a random binary sequence. Each of the data converters includes a first sampling switch and a second sampling switch. The first sampling switch and the second sampling switch are configured to receive the random binary sequence from the signal generator. The first sampling switch and second sampling switch are further configured to sampling either the positive polarity of the input signal or the negative polarity of the input signal based on the random binary sequence. The aggregator circuit is configured to sample the data converters and produce an output spectrum.

Embodiments of the present disclosure include a method for reducing offset tone in a data converter. The method includes generating, with a signal generator, a random binary sequence; receiving, with a data converter, the random binary sequence and an input signal; and sampling, with the data converter, a positive polarity of the input signal and a negative polarity of the input signal based on the random binary sequence.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
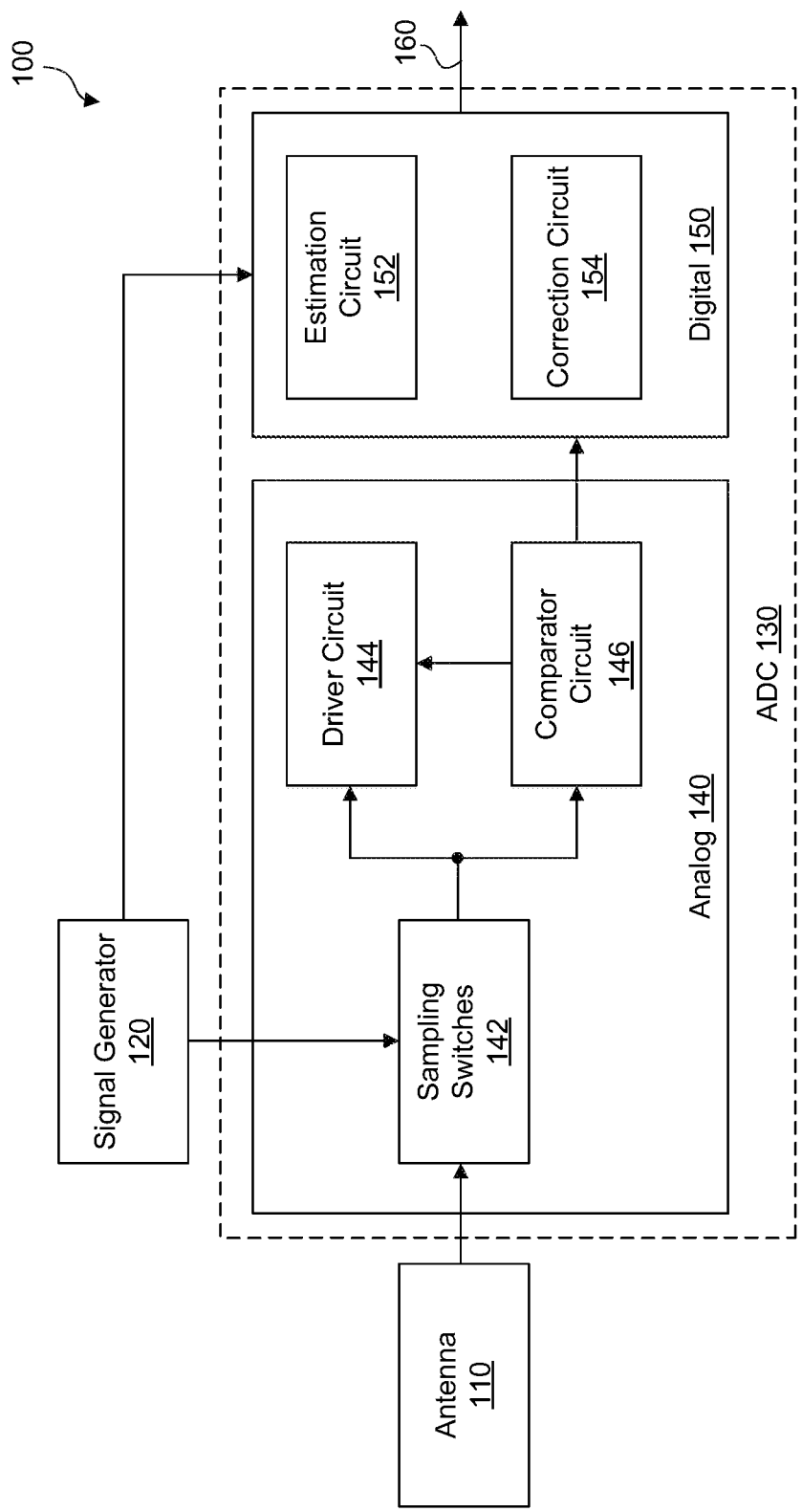
FIG. 1 is an illustration of a block-level representation of an electronic system, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

It is noted that references in the specification to "one embodiment," "an embodiment," "an example embodiment," and "exemplary" indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

It is to be understood that the phraseology or terminology herein is for the purpose of description and not of limitation, such that the terminology or phraseology of the present specification is to be interpreted by those skilled in relevant art(s) in light of the teachings herein.

The following disclosure describes aspects of a data converter configured to reduce low frequency offset tones that may appear as spurs in a final output spectrum of the data converter. Embodiments of the present disclosure include an ADC circuit with an analog circuit configured to receive an input signal and a random binary sequence that determines whether the ADC circuit samples a positive polarity or a negative polarity of the input signal. The ADC circuit also includes a digital circuit with an estimation circuit configured to determine a first offset voltage and a second offset voltage associated with sampling either the positive or the negative polarity of the input signal. The digital circuit also includes a correction circuit that subtracts, or removes, either the first or the second offset voltage from the value of the sampled input signal from the analog circuit.

The ADC circuit is configured to sample the positive or the negative polarity of the input signal based on a random binary sequence. When arranged in an interleaving manner with multiple ADC circuit lanes, the ADC circuit can sample the input signal simultaneously using time-multiplexing without requiring an inoperative ADC circuit lane that is not actively being used to sample. The analog circuit of each ADC circuit in the interleaved arrangement can sample either the positive or the negative polarity of the input signal and an offset voltage associated with the ADC circuit's sampling switches. In the digital circuit of each ADC circuit in the interleaved arrangement, the offset voltage can be removed before a final output spectrum.

FIG. 1 is an illustration of a block-level representation of an electronic system 100, according to some embodiments. Electronic system 100 includes an antenna 110, a signal generator 120, and a data converter 130. Antenna 110 is configured to provide an input signal to data converter 130. In some embodiments, the input signal is a high frequency signal, such radio frequency signals used in wireless and wireline communication systems, which can provide a voltage input to data converter 130.

Signal generator 120 can generate a random binary sequence that can be provided to data converter 130. In some embodiments, the random binary sequence generated by signal generator 120 can have an equal number of zeros and ones. Signal generator 120 can provide the random binary sequence to an analog circuit 140 and a digital circuit 150 in data converter 130, according to some embodiments.

In some embodiments, the random binary sequence generated by signal generator 120 is used to generate a pseudorandom binary sequence. Further, the random binary sequence or pseudorandom binary sequence can correspond to a control signal that is used by analog circuit 140 and digital circuit 150 of data converter 130. The control signal can have values of "+1" or "−1." A "+1" in the control signal can correspond to a "0" in the random binary sequence or pseudorandom binary sequence. A "−1" in the control signal can correspond to a "1" in the random binary sequence or the pseudorandom binary sequence.

In some embodiments, data converter 130 includes analog circuit 140 and digital circuit 150. Analog circuit 140 includes sampling switches 142, a driver circuit 144, and a comparator circuit 146. Sampling switches 142 are configured to receive the input signal from antenna 110 and the random binary sequence from signal generator 120. Based on the random binary sequence, sampling switches 142 sample a positive polarity of the input signal or a negative polarity of the input signal. In some embodiments, sampling switches 142 can be configured to receive the pseudorandom binary sequence or the control signal from signal generator 120 to sample a positive polarity of the input signal or a negative polarity of the input signal.

Comparator circuit 146 is configured to receive the positive polarity or the negative polarity of the input signal, based on the random binary sequence received by sampling switches 142. Driver circuit 144 can create a closed loop feedback circuit, which allows analog circuit 140 to have an improved representation of the sampled input signal.

Referring to FIG. 1, digital circuit 150 of data converter 130 is configured to receive the random binary sequence from signal generator 120 and a value of the sampled input signal (e.g., a digital value) from analog circuit 140. Digital circuit 150 includes an estimation circuit 152 and a correction circuit 154. Estimation circuit 152 is configured to measure an offset voltage associated with sampling the positive or the negative polarity of the input signal due to sampling switches 142 and components of driver circuit 144 and comparator circuit 146 in analog circuit 140. In some embodiments, based on the random binary sequence received from signal generator 120, estimation circuit 152 is configured to determine a first offset voltage associated with sampling the positive polarity of the input signal and a second offset voltage associated with sampling the negative polarity of the input signal. Estimation circuit 152 can indicate to correction circuit 154 which of the first offset voltage or the second offset voltage to use when modifying from the value of the sampled input signal—e.g., subtracting the first offset voltage or the second offset voltage-based on which polarity of the input signal was sampled as indicated by the random binary sequence. Correction circuit 154 is configured to adjust the value of the sampled input signal received from analog circuit 140—e.g., remove the appropriate offset voltage from the value of the sampled input signal, thus generating a digital output 160.

Figure 2:
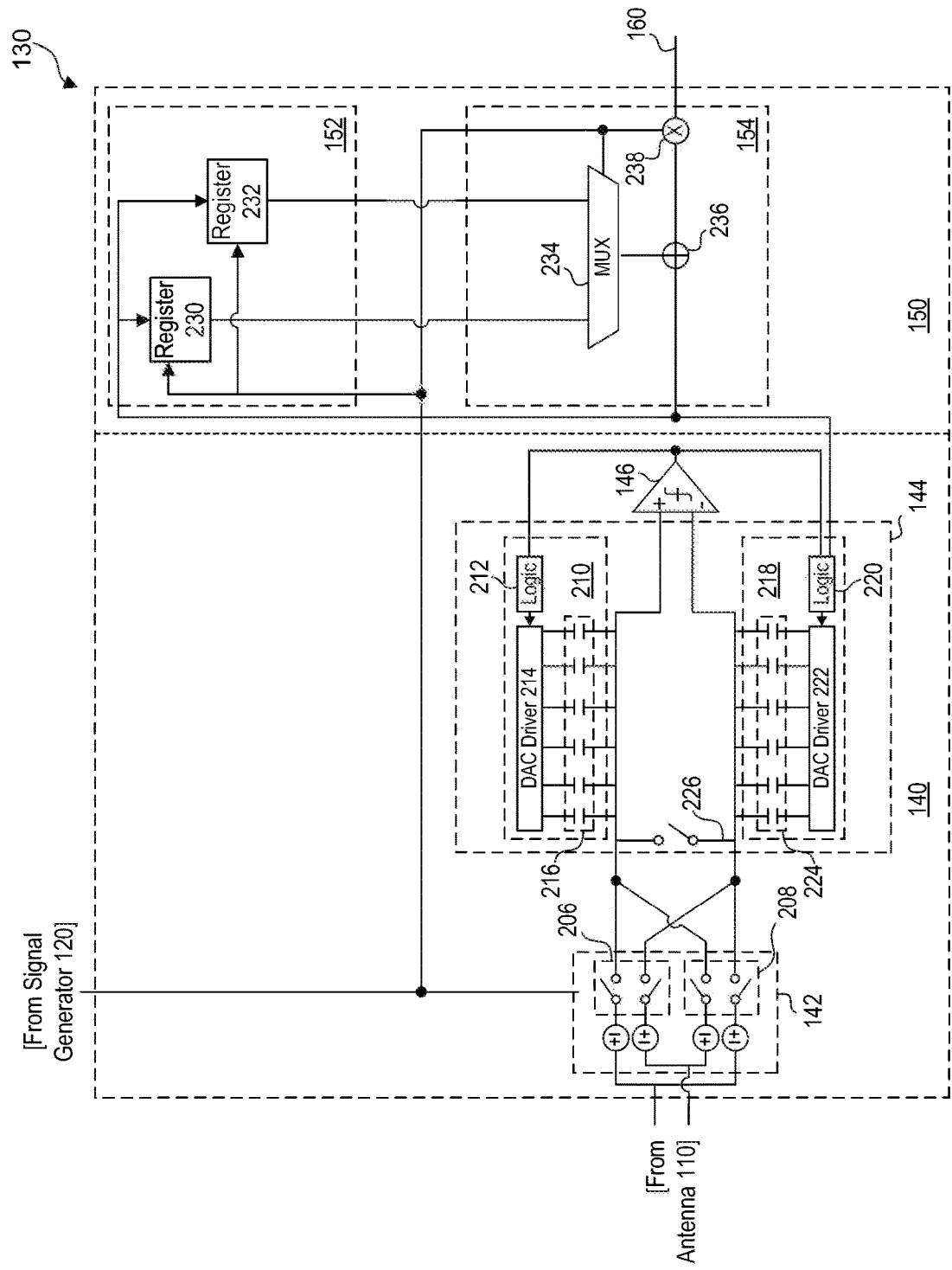
FIG. 2 is illustration of a circuit-level representation of a data converter, according to some embodiments.

FIG. 2 is an illustration of a circuit-level representation of data converter 130, according to some embodiments. In some embodiments, data converter 130 can be an analog-to-digital converter (ADC) circuit (also referred to herein as "ADC circuit 130") that includes analog circuit 140 and digital circuit 150.

Analog circuit 140 includes sampling switches 142, driver circuit 144, and comparator circuit 146. In some embodiments, sampling switches 142 receive the random binary sequence from signal generator 120 and the input signal from antenna 110. The input signal can be a high frequency signal, such radio frequency signals used in wireless and wireline communication systems, and can be based on a voltage, according to some embodiments. In some embodiments, sampling switches 142 include a first sampling switch 206 and a second sampling switch 208. First sampling switch 206 samples the positive polarity of the input signal and second sampling switch 208 samples the negative polarity of the input signal—or vice versa—according to some embodiments. In some embodiments, each of first sampling switch 206 and second sampling switch 208 includes two switches to electrically connect to the positive and negative polarities (or nodes) of the input signal from antenna 110.

In some embodiments, sampling switches 142 receive either a "+1" or a "−1" based on the random binary sequence from signal generator 120. If sampling switches 142 receive a "+1" from signal generator 120, based on the random binary sequence, first sampling switch 206 is used to sample the positive polarity of the input signal. If sampling switches 142 receive a "−1" from signal generator 120, based on the random binary sequence, second sampling switch 208 is used to sample the negative polarity of the input signal. Either first sampling switch 206 or second sampling switch 208 can be configured to sample the positive or negative polarity of the input signal based on the random binary sequence from signal generator 120, according to some embodiments.

Referring to FIG. 2, sampling switches 142 are electrically connected to driver circuit 144 and comparator circuit 146. Comparator circuit 146 and driver circuit 144 can include any suitable type of electronic device or component, including a comparator, capacitors, and resistors. Comparator circuit 146 can receive either the sampled positive polarity of the input signal from first sampling switch 206 or the sampled negative polarity of the input signal from second sampling switch 208. Comparator circuit 146 is electrically connected to driver circuit 144. In some embodiments, driver circuit 144 can provide a feedback loop for comparator circuit 146. Driver circuit 144 includes a first driver circuit 210 and a second driver circuit 218. In some embodiments, first driver circuit 210 includes a logic circuit 212, a digital-to-analog (DAC) driver 214, and capacitive elements 216. Second driver circuit 218 includes a logic circuit 220, a DAC driver 222, and capacitive elements 224, according to some embodiments. Driver circuit 144 can also be electrically connected to reset switch 226.

As described above, sampling switches 142 in analog circuit 140 receive the random binary sequence from signal generator 120, in which sampling switches 206 and 208 sample either the positive polarity of the input signal or the negative polarity of the input signal received from antenna 110. Comparator circuit 146 receives the sampled positive and negative polarities of the input signal from sampling switches 142 and compares the input signals, producing a digital output with N number of bits. The digital output of comparator circuit 146 is used in a feedback loop for driver circuit 144. Driver circuit 144 receives the digital output from comparator circuit 146, and logic circuits 212 and 220 collect data over N number of bits for either the sampled positive polarity or negative polarity of the input signal. The output of analog circuit 140, from logic circuits 212 and 220, is received by estimation circuit 152. DAC drivers 214 and 222 receive the digital output from logic circuits 212 and 220, respectively. DAC drivers 214 and 222 convert the digital output into an analog output to be used in the feedback loop of analog circuit 140. Driver circuit 144 also includes a set of capacitive elements 216 and 224 that are electrically connected to first sampling switch 206 and second sampling switch 208 and DAC drivers 214 and 222, respectively. Capacitive elements 216 and 224 operate as hold capacitors, which charge while sampling switches 142 are sampling the input signal. During the reset phase, the charge is removed by setting driver circuit 144 to differential zero voltage, or ground, using reset switch 226.

In some embodiments, driver circuit 144 can have a reset phase. Driver circuit 144 is set to ground—using reset switch 226—after sampling switches 142 have sampled the input signal and the feedback loop is complete, or before the next sampling period. In some embodiments, the capacitive elements of first driver circuit 210 and second driver circuit 218 can be set to ground, which initializes the sampling operation of ADC circuit 140. The reset phase can allow driver circuit 144 to begin a sampling period of the input signal with a 0 V differential capacitive charge, according to some embodiments. The reset phase for driver circuit 144 can allow ADC circuit 140 to operate without signal dependency and can increase the efficiency and performance of the circuit design.

Comparator circuit 146 receives either the positive or negative polarity of the input signal from sampling switches 142 and produces a digital output with N number of bits, according to some embodiments. The digital output from comparator circuit 146 may be affected by offset voltages from analog circuit 130. In some embodiments, there are two offset voltages: a first offset voltage associated with sampling the positive polarity of the input signal and a second offset voltage associated with sampling the negative polarity of the input signal. The first offset voltage and the second offset voltage can have two components: an offset voltage from sampling switches 142 and an offset voltage from comparator circuit 146 and driver circuit 144 (among other circuits/components in analog circuit 140). Sampling switches 142 can have a charge injection that creates an offset voltage. For example, first sampling switch 206 and second sampling switch 208 can have charge injections that create different offset voltages for each switch, therefore creating the first offset voltage associated with sampling the positive polarity of the input signal and the second offset voltage associated with sampling the negative polarity of the input signal. The charge injection can vary and can be unique for each of first sampling switch 206 and second sampling switch 208, according to some embodiments.

Referring to FIG. 2, digital circuit 150 includes estimation circuit 152 and correction circuit 154. Estimation circuit 152 is configured to receive the random binary sequence from signal generator 120 and the digital value of the sampled input signal from analog circuit 140. In some embodiments, logic circuit 212 or logic circuit 220 may provide the digital value of the sampled input signal to estimation circuit 152. Additionally, estimation circuit 152 is configured to measure the first offset voltage associated with sampling the positive polarity of the input signal and the second offset voltage associated with sampling the negative polarity of the input signal, according to some embodiments. For example, before sampling operations, estimation circuit 152 can measure the offset voltages of first sampling switch 206 and second sampling switch 208 and the core ADC circuit 130 offset voltage (e.g., caused by circuits/components of comparator circuit 146 and driver circuit 144).

Estimation circuit 152 includes a first register 230 and a second register 232, according to some embodiments. In some embodiments, first register 230 determines a digital equivalent of the offset voltage associated with sampling the positive polarity of an input signal, where the core ADC circuit 130 offset voltage and the charge injection of the first sampling switch 206 both contribute to the final offset voltage associated with sampling the positive polarity of the input signal. Second register 232 determines a digital equivalent of the offset voltage associated with sampling the negative polarity of an input signal, where the core ADC circuit 130 offset voltage and the charge injection of the second sampling switch 208 both contribute to the final offset voltage value associated with sampling the negative polarity of the input signal. In some embodiments, the final offset voltages associated with sampling the positive and negative polarities of the input signal is an average value based on the data accumulated by first register 230 and second register 232.

Estimation circuit 152 determines the offset values by applying a zero voltage input in place of the input signal from antenna 110. Based on the random binary sequence, first register 230 accumulates the data stream associated with the offset voltage from sampling the positive polarity of the input signal, which is a zero voltage input during calibration. Similarly, second register 232 accumulates the data stream associated with the offset voltage from sampling the negative polarity of the input signal. Estimation circuit 152 can then indicate to correction circuit 154 to modify the value of the sampled input signal (determined by analog circuit 140) based on the first offset voltage or the second offset voltage—e.g., subtracting the first offset voltage or the second offset voltage from the value of the sampled input signal.

In some embodiments, correction circuit 154 receives the random binary sequence from signal generator 120 and the value of the sampled input signal. Based on the output of estimation circuit 152, correction circuit 154 can remove either the first offset voltage or the second offset voltage from the value of the sampled input signal, according to some embodiments. By determining and removing the offset voltages associated with sampling the positive and the negative polarities of the input signal, estimation circuit 152 and correction circuit 154 allow digital circuit 150 to reduce a low frequency tone that may appear in the final output spectrum of electronic system 100 in FIG. 1.

Correction circuit 154 can include a multiplexer circuit 234, a summation circuit 236, and a multiplier circuit 238. Correction circuit 154 receives the random binary sequence from signal generator 120, the sampled input signal (e.g., a digital value) from analog circuit 140, and the value of the offset voltages associated with sampling the positive and negative polarities of the input signal from estimation circuit 152. Based on the random binary sequence, multiplexer circuit 234 can pass either the offset voltage associated with sampling the positive polarity or the offset voltage associated with sampling the negative polarity to summation circuit 236. For example, when the random binary sequence is a "−1," the multiplexer can pass the offset voltage associated with sampling the negative polarity to summation circuit 236; and when the random binary sequence is a "+1," the multiplexer can pass the offset voltage associated with sampling the positive polarity to summation circuit 236. Summation circuit 236 receives the sampled input signal (e.g., a digital value) from analog circuit 140 and the corresponding offset value and removes the corresponding offset value from the sampled input value, according to some embodiments. Multiplier circuit 238 receives the digital output of the sampled input signal with the offset removed from summation circuit 236 and the random binary sequence, according to some embodiments. Multiplier circuit 238 multiplies the digital output with the offset removed by either "+1" or "−1" based on the random binary sequence to generate digital output 160.

Figure 3:
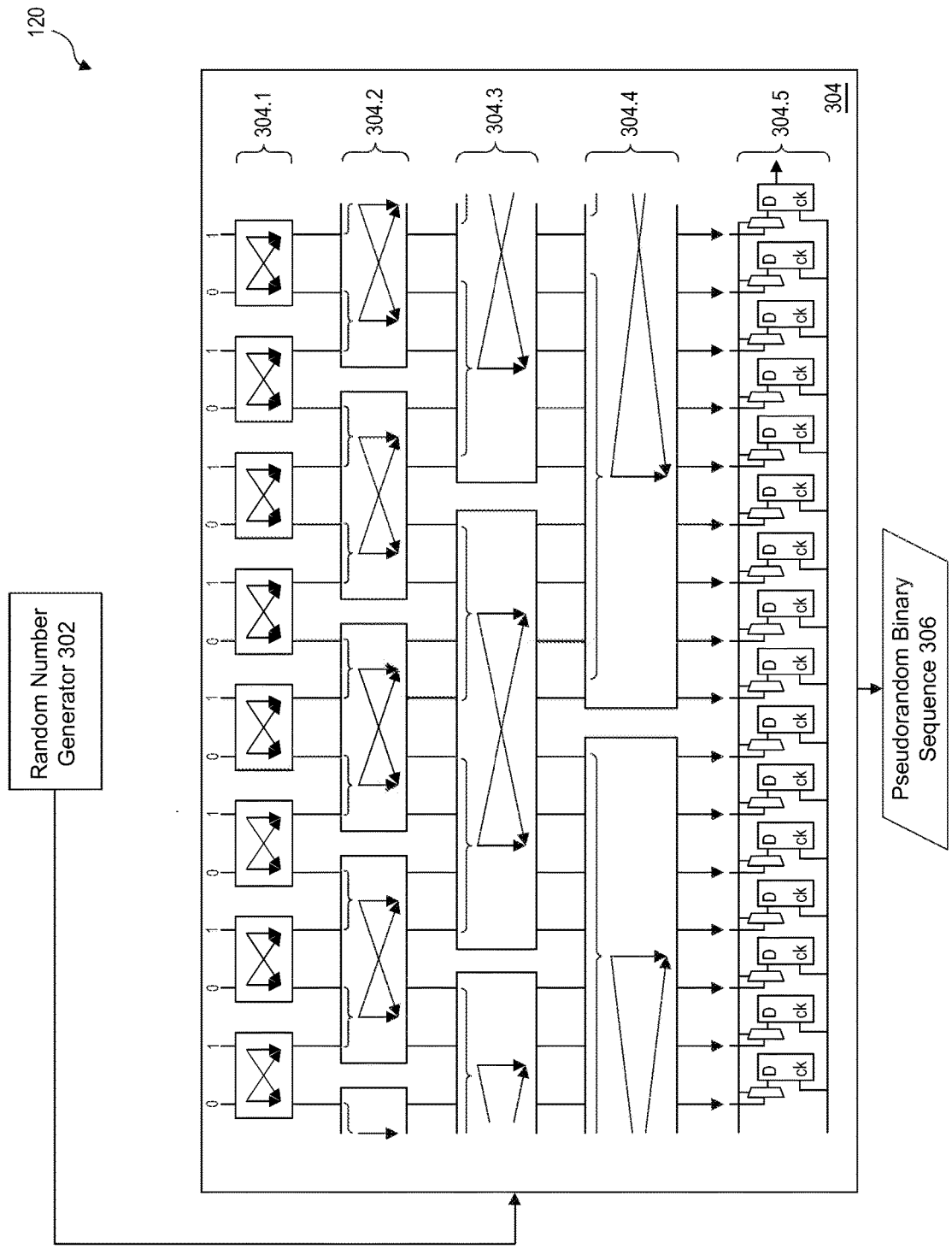
FIG. 3 is an illustration of a block-level representation of a signal generator, according to some embodiments.

FIG. 3 is an illustration of a block-level representation of signal generator 120, according to some embodiments. Signal generator 120 includes a random number generator 302, a zero bias coder 304, and a pseudorandom binary sequence 306. Random number generator 302 is configured to generate the binary sequence. Random number generator 302 can be any suitable random number generator or combination of components suitable to generate the random binary sequence, such as [01010101] or [00001111], in which any order of binary bits is acceptable as long as there are an equal number of zeros and ones. The length of the binary sequence can correspond to the number of ADC circuit channels in electronic system 100, as described with respect to FIGS. 5 and 6 below. In some embodiments, random number generator 302 can generate a binary sequence made up of an equal number of zeros and ones. The binary sequence is an input to zero bias coder 304, according to some embodiments.

Zero bias coder 304 can produce pseudorandom binary sequence 306, which is a reordered combination of a binary sequence. The series of multiplexers in zero bias coder 304, as shown in FIG. 3, is based on a binary tree architecture with a first layer of multiplexers 304.1, a second layer of multiplexers 304.2, a third layer of multiplexers 304.3, and a fourth layer of multiplexers 304.4. Zero bias coder 304 also includes a set of flip flops 304.5. To create pseudorandom binary sequence 306, zero bias coder 304 can include at least two layers of multiplexers to ensure the pseudorandom binary sequence is sufficiently randomized. For example, a "0" and "1" are used as an input to each of the multiplexers in each layer of zero bias coder 304. Random number generator 302 generates a random sequence to change the permutation of each multiplexer in each layer of multiplexers in zero bias coder 304. Each of the four layers of multiplexers generates a permutation based on the random sequence from random number generator 302, starting with the input of a "0" and "1" to each of the multiplexers at first layer of multiplexers 304.1. Second layer of multiplexers 304.2 generates a permutation of the binary sequence from first layer of multiplexers 304.1, third layer of multiplexers 304.3 generates a permutation from second layer of multiplexers 304.2, and fourth layer generates a permutation from third layer of multiplexers 304.3. The multiplexers in each layer following first layer 304.1 receive the permutation of "0" and "1" inputs from the previous layer and a number from the random sequence from random number generator 302. Based on the random number from random number generator 302, the permutation is reordered by the multiplexers in the layer and passed to the next layer. In some embodiments, the set of flip flops 304.5 receives the final permutation from fourth layer of multiplexers 304.4 and stores the final permutation to create pseudorandom binary sequence 306. In some embodiments, a single-bit swapper can be implemented with two 2-to-1 multiplexers. For example, first layer of multiplexers 304.1 can include 16 2-to-1 multiplexers.

Because each of the layers of multiplexers receives and passes forward a permutation of the "0" and "1" inputs from first layer of multiplexers 304.1, pseudorandom binary sequence 306 results in a permutation of a sequence with an equal number of zeros and ones having zero means. The zero means pseudorandom binary sequence 306 creates a sequence with minimum frequency content in the low frequency range while ADC circuit 130 is sampling either the positive or negative polarity of the input signal. A non-zero means pseudorandom binary sequence, which may not have an equal number of zeros and ones, can create a white spectrum. But, pseudorandom binary sequence 306, with an equal number of zeros and ones, has the low-frequency component removed. By minimizing the frequency content in the low frequency range, low frequency content that may be amplified during operation does not appear in the final spectrum as low frequency offset tones.

Referring to FIGS. 2 and 3, in some embodiments, pseudorandom binary sequence 306 is used as the random binary sequence which is received by sampling switches 142 in analog circuit 140. A "0" in pseudorandom binary sequence 306 can indicate using first sampling switch 206 to sample the positive polarity of the input signal and a "1" in pseudorandom binary sequence 306 can indicate using second sampling switch 208 to sample the negative polarity of the input signal. Additionally, pseudorandom binary sequence 306 can be used as the basis for the control signal, according to some embodiments. For example, if pseudorandom binary sequence 306 has a "0" in its sequence, this can appear as a "+1" in the control signal. Conversely, if pseudorandom binary sequence 306 has a "1" in its sequence, this can appear as a "−1" in the control signal. A value of "+1" in the control signal can be associated with ADC circuit 130 sampling the positive polarity of the input signal and a value of "−1" in the control signal can be associated with ADC circuit 130 sampling the negative polarity of the input signal.

Figure 4:
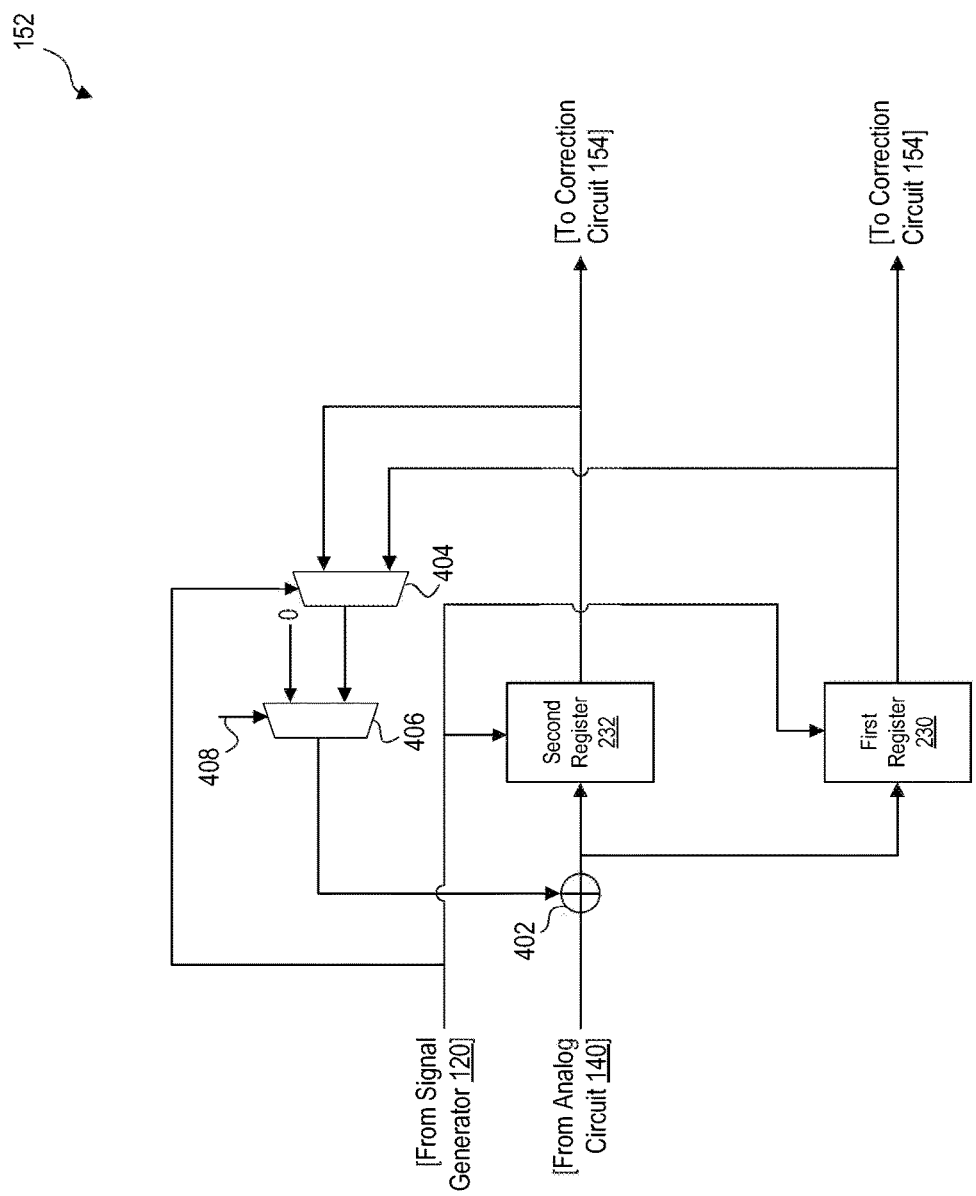
FIG. 4 is an illustration of a circuit-level representation of a digital circuit in a data converter, according to some embodiments.

FIG. 4 is an illustration of a circuit-level representation of estimation circuit 152. As described above, estimation circuit 152 can estimate the offset voltage caused by the charge injection from first sampling switch 206 and second sampling switch 208 and core ADC offset voltage from driver circuit 144 and comparator circuit 146. In some embodiments, estimation circuit 152 includes first register 230, second register 232, a summation circuit 402, a first multiplexer 404, and a second multiplexer 406. First register 230 and second register 232 can be registers or any suitable type of electronic component or device. In some embodiments, to estimate the offset voltage from sampling the positive polarity and negative polarity of the input signal, estimation circuit 152 accumulates data and determines a first offset value associated with sampling the positive polarity and a second offset value associated with sampling the negative polarity of the input signal and provides the offset values to correction circuit 154. In some embodiments, the first and second offset values are an average offset value determined during estimation.

A zero voltage is applied to analog circuit 140 in place of the input signal from antenna 110. First register 230 and second register 232 are configured to accumulate the data stream from analog circuit 140, which includes the offset voltage from the charge injection and core ADC offset voltage. First register 230 accumulates data associated with sampling the positive polarity, and second register 232 accumulates data associated with sampling the negative polarity of the input signal. As data is accumulated by first register 230 and second register 232, a feedback loop is implemented to determine the average offset value.

The feedback loop includes first multiplexer 404, second multiplexer 406, and summation circuit 402, according to some embodiments. The accumulated data from first register 230 and second register 232 are inputs to first multiplexer 404. Based on the random binary sequence from signal generator 120, first multiplexer 404 selects the accumulated data from either first register 230 or second register 232 to pass forward. For example, during estimation of the offset, a zero voltage is applied to analog circuit in place of the input signal from antenna 110. If the random binary sequence is set to "0," which corresponds to a "+1" in the control signal for estimation of the offset, sampling switch 206 samples the zero voltage input and a digital output is produced from comparator circuit 146 corresponding to an offset value associated with sampling the positive polarity. If the random binary sequence is set to "1," which corresponds to a "−1" for estimation of the offset, sampling switch 208 samples the zero voltage input and a digital output is produced from comparator circuit 146 corresponding to an offset value associated with sampling the negative polarity. First register 230 and second register 232 accumulate data representing the first and second offset values. The accumulated data is an input for first multiplexer 404. First multiplexer 404 receives data from first register 230 and second register 232 and the random binary sequence. When the random binary sequence is a "+1," the data from first register 230 is passed through first multiplexer 404 and second multiplexer 406. When the random binary sequence is a "−1," the data from second register 232 is passed through first multiplexer 404 and second multiplexer 406. Second multiplexer 406 is controlled by a clocking signal 408 for when ADC circuit 130 is used for estimation of the offset rather than sampling the input signal. Summation circuit 402 can receive data from the feedback loop and data continuously being accumulated while the random binary sequence is set to "+1" and determine the average. The average value is then received by first register 230. The first offset value is provided to correction circuit 154, where it can be removed from the sampled input signal of analog circuit 140. By using the random binary sequence to determine whether data from first register 230 or second register 232 should be passed forward, a single summation circuit 402 is required, which reduces the area requirements of the circuit, according to some embodiments.

In some embodiments, second multiplexer 406 receives the output of first multiplexer 404 and a "0" value as inputs. Second multiplexer 406 is controlled by clocking signal 408, which indicates whether to pass the "0" value input or the input from first multiplexer 404. When data is initially accumulated in first register 230 and second register 232, the feedback loop does not initially have data. Second multiplexer 406 can pass the "0" input through for initialization. After the initial data is accumulated, second multiplexer 406 can pass the input from first multiplexer 404 through to summation circuit 402.

Figure 5:
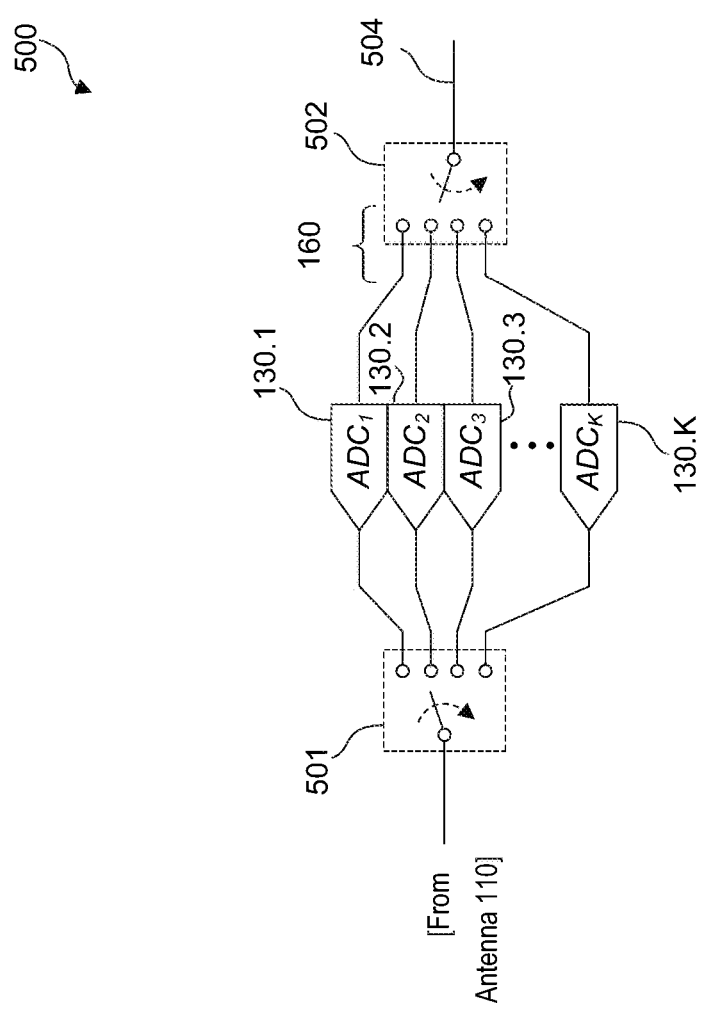
FIG. 5 is a block-level representation of a time-interleaved analog-to-digital converter circuit, according to some embodiments.

FIG. 5 is an illustration of a block-level representation of a time-interleaved ADC circuit 500, according to some embodiments. ADC circuit 500 includes antenna 110, a k number of ADC circuit lanes (e.g., ADC circuit lane 130.1, ADC circuit lane 130.2, ADC circuit lane 130.3, . . . , 130.k), in which each lane includes ADC circuit 130. First and second aggregator circuits 501 and 502 allow the input signal from antenna 110 to be used by each of the k number of ADC circuit lanes. First aggregator circuit 501 time-multiplexes the input signal, allowing each of k number of ADC circuit lanes to sample the input signal. Second aggregator circuit 502 uses time-multiplexing to combine different phases of the sampled input signal from each ADC circuit lane. The combined values of the sampled input signal of each ADC circuit lane produce a final output spectrum that includes an aggregated output 504. Each of the ADC circuit lanes can operate at a sampling rate of "$F_s/k$," where "$F_s$" is the sampling frequency and "k" represents the number of ADC circuit lanes.

Each ADC circuit 130 in the k number of ADC circuit lanes sample the time multiplexed input signal from antenna 110, according to some embodiments. Each of the k number of ADC circuit lanes receives a portion of the time multiplexed input signal, therefore allowing each of the k number of ADC circuit lanes to be used during sampling of the input signal without requiring an extra lane. By randomly sampling the positive or the negative polarity of the input signal using sampling switches 142 in each ADC circuit 130 in the k number of ADC circuit lanes based on the random binary sequence, each of the ADC circuit lanes can simultaneously sample the input signal. This random sampling can reduce the effects that offset mismatches among the ADC circuit lanes can have on the final output spectrum. The randomization of the sampling of either the positive or negative polarity of the input signal can mitigate drift in mismatches among ADC circuit lanes by spreading the mismatch noise which would be at a fixed frequency for each of the ADC circuit lanes to a pseudorandom pattern that has a white spectrum. The combination of random and simultaneous sampling of each ADC circuit lane promotes an efficient circuit layout that does not require an additional stagnant ADC circuit lane to shuffle the sampling order as in other time-interleaved data converter designs.

Figure 6:
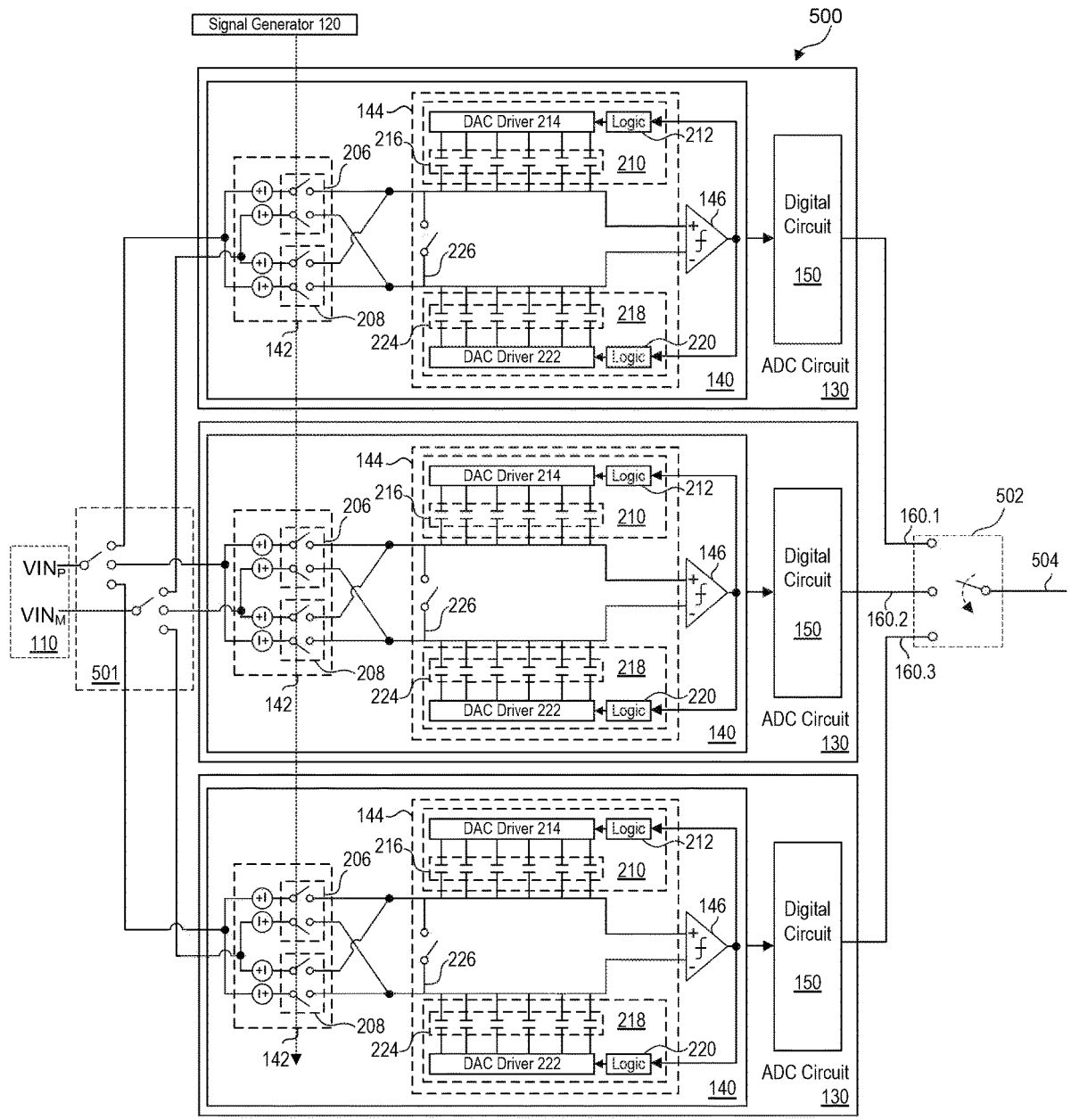
FIG. 6 is an illustration of a circuit-level representation of a time-interleaved analog-to-digital converter circuit, according to some embodiments.

FIG. 6 is an illustration of a circuit-level representation of ADC circuit 500, according to some embodiments. Each of the k-way ADC circuit lanes includes ADC circuit 130, receives the input signal from antenna 110, and samples either the positive or negative polarity of the input signal based on the random binary sequence. The time frame of sampling can be divided into sections among the ADC circuit lanes, in which each ADC circuit lane contributes to the aggregated digital output for a particular phase representing the input signal in a section of time. Aggregator circuit 502 multiplexes digital output 160 for each of the ADC circuit lanes for the corresponding section of time. For example, for three ADC circuit lanes with three separate digital outputs, a first digital output 160.1 is multiplexed for a first time section, a second digital output 160.2 is multiplexed for a second time section, and a third digital output 160.3 is multiplexed for a third time section. Aggregated digital output 504 represents a full sampling time frame—e.g., the combination of time multiplexed digital outputs 160.1, 160.2, and 160.3.

In some embodiments, the k value of ADC circuit 500 is three, as shown by the three ADC circuit lanes (each including ADC circuit 130). In some embodiments, there can be more or less ADC circuit lanes, changing the k value. Additional ADC circuit lanes, which increase the k value, allow ADC circuit 500 to sample the input signal at a lower sampling rate. By lowering the sampling rate, ADC circuit 500 can achieve an optimal energy-speed tradeoff that allows the multiple ADC circuit lanes to sample at a lower rate, relaxing the speed requirements for each ADC circuit lane and reducing the sensitivity of ADC circuit 500 to metastability.

Figure 7:
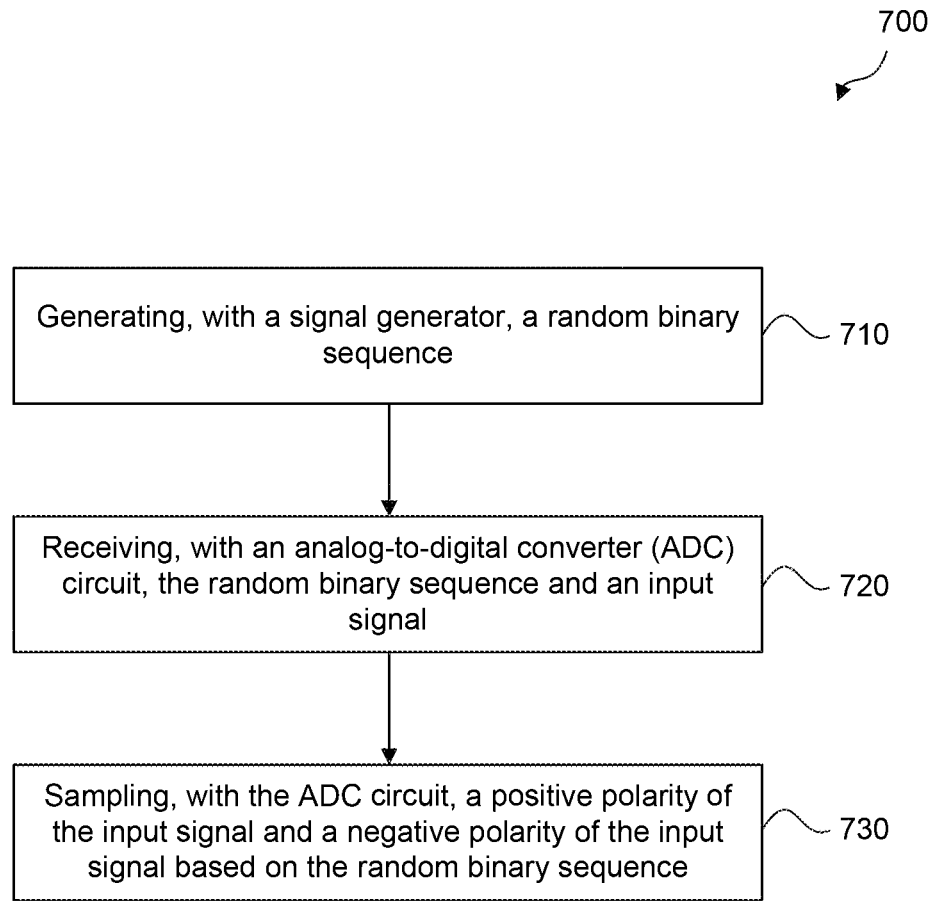
FIG. 7 is an illustration of a method for reducing offset tone in a data converter, according to some embodiments.

FIG. 7 is an illustration of a method 700 for reducing offset tone in a data converter, according to some embodiments. For illustrative purposes, the operations illustrated in method 700 will be described with reference to the circuit-level representations in FIGS. 2 and 3. Other representations of electronic system 100 are within the scope of the present disclosure. Also, additional operations may be performed between various operations of method 700 and may be omitted merely for clarity and ease of description. The additional operations can be provided before, during, and/or after method 700, in which one or more of these additional operations are briefly described herein. Moreover, not all operations may be need to perform the disclosure provided herein. Additionally, some of the operations may be performed simultaneously or in a different order than shown in FIG. 7. In some embodiments, one or more other operations may be performed in addition to or in place of the presently-described operations.

At operation 710 of FIG. 7, a random binary sequence is generated in a signal generator. Referring to FIG. 2, signal generator 120 generates the random binary sequence.

At operation 720 of FIG. 7, the random binary sequence and an input signal are received by an ADC circuit. Referring to FIG. 2, analog circuit 130 receives the random binary sequence from signal generator 120 and the input signal from antenna 110. In some embodiments, sampling switches 142 in analog circuit 140 receive the random binary sequence and the input signal.

At operation 730 of FIG. 7, a positive polarity of the input signal or a negative polarity of the input signal is sampled by the ADC circuit based on the random binary sequence. Referring to FIG. 2, if the random binary sequence received is a "1," sampling switches 142 allow ADC circuit 130 to sample the positive polarity of the input signal. Conversely, if the random binary sequence received is a "0," sampling switches 142 allow ADC circuit 130 to sample the negative polarity of the input signal. In some embodiments, first sampling switch 206 samples the positive polarity of the input signal and second sampling switch 208 samples the negative polarity of the input signal.

In some embodiments, after ADC circuit 130 samples either the positive polarity of the input signal or the negative polarity of the input signal, driver circuit 144 has a reset phase before another sampling phase begins. Capacitive elements 216 and 224 of first driver circuit 210 and second driver circuit 218, respectively, are set to ground. The resent phase allows ADC circuit 130 to begin an initial sampling cycle (and subsequent sampling cycles) with a zero voltage capacitive charge.

Referring to signal generator 120 in FIG. 3, in some embodiments, the random binary sequence is pseudorandom binary sequence 306, which is generated by zero bias coder 304 using the binary sequence in signal generator 120. Zero bias coder 304 includes multiple layers of multiplexers. Each of the multiplexers in first layer of multiplexers 304.1 receives a "0" and "1" input, so there are an equal number of zeros and ones. First layer of multiplexers 304.1 generates a permutation of the binary sequence based on a random sequence from random number generator 302 and passes the permutation to second layer of multiplexers 304.2. Based on the random sequence from random number generator 302, second layer of multiplexers 304.2 generates another permutation of the binary sequence received from first layer of multiplexers 304.1 to further randomize the sequence. In some embodiments, there may be two layers of multiplexers, but two layers is a minimum and there may be more layers depending on the desired level of randomization for the random binary sequence. The numbers of zeros and one are constant and equal in each permutation. The order of zeros and ones in each permutation can be variable. The final sequence is the random binary sequence and in some embodiments pseudorandom binary sequence 306.

Further, in some embodiments, pseudorandom binary sequence 306 is a control signal where "0" corresponds to "+1" and "1" corresponds to "−1" in the control signal. The control signal can be used to indicate to sampling switches 142 to sample either the positive or negative polarity of the input signal. For example, when the control signal is a "+1," first sampling switch 206 samples the positive polarity of the input signal. When the control signal is "−1," second sampling switch 208 samples the negative polarity of the input signal.

A benefit of randomly sampling the positive polarity of the input signal or the negative polarity of the input signal based on the random binary sequence, among others, is that ADC circuit 130 is able to spread the low frequency offset over the Nyquist band. By using pseudorandom binary sequence 306 as the random binary sequence, ADC circuit 130 does not follow a 50% duty cycle of sampling the positive polarity of the input signal or the negative polarity of the input signal. The zero-mean pseudorandom binary sequence has the low-frequency component removed. Therefore, when a moving average filter is applied to the digital output, there is a near zero (or zero) means spectrum.

Figure 8:
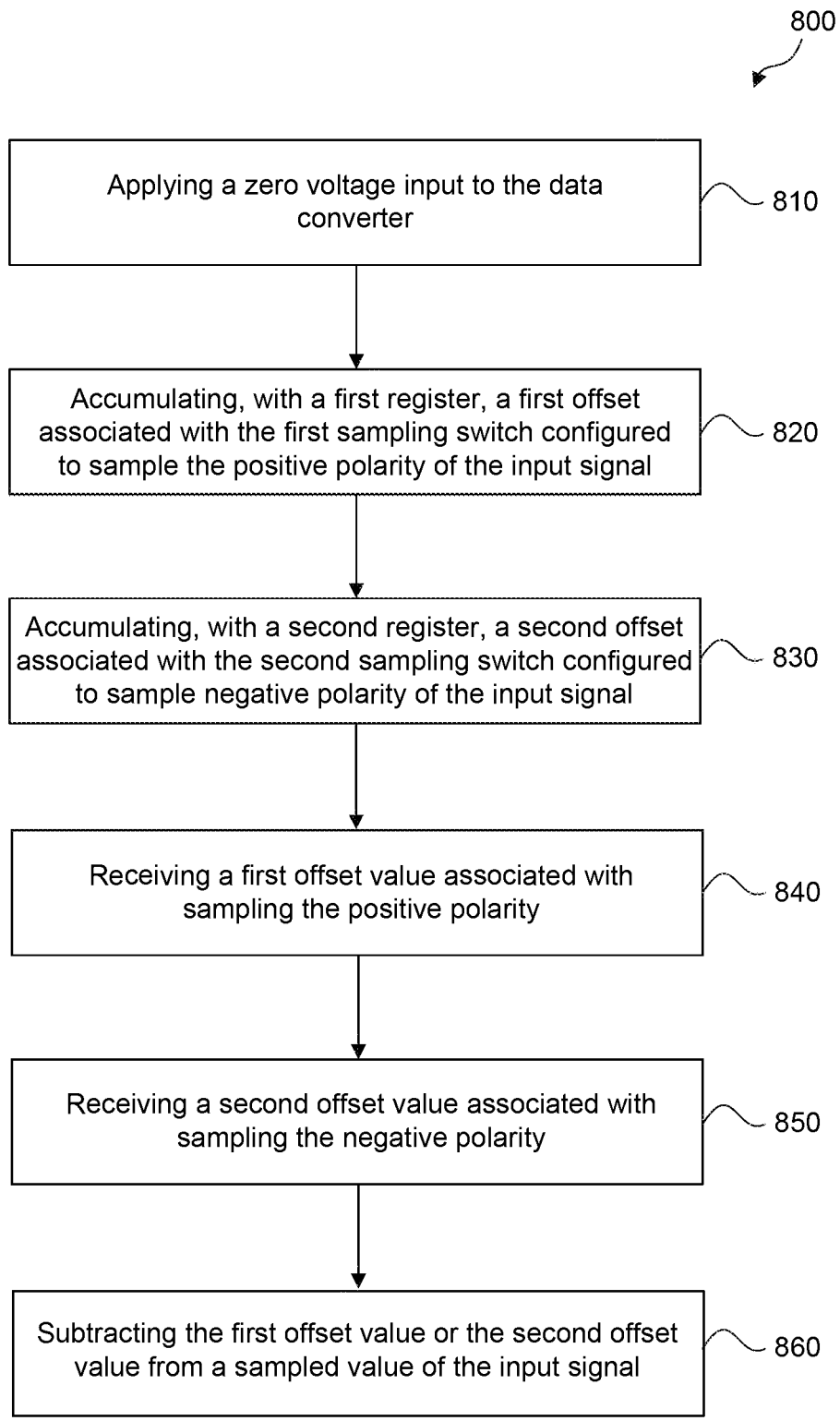
FIG. 8 is an illustration of a method for calibrating a data converter, according to some embodiments.

FIG. 8 is an illustration of a method 800 for calibrating a data converter, according to some embodiments. For illustrative purposes, the operations illustrated in method 800 will be described with reference to the circuit-level representations of FIGS. 2 and 4. Other representations of electronic system 100 are within the scope of the present disclosure. Also, additional operations may be performed between various operations of method 800 and may be omitted merely for clarity and ease of description. The additional operations can be provided before, during, and/or after method 800, in which one or more of these additional operations are briefly described herein. Moreover, not all operation may be needed to perform the disclosure provided herein. Additionally, some of the operations may be performed simultaneously or in a different order than shown in FIG. 8. In some embodiments, one or more other operations may be performed in addition to or in place of the presently-described operations.

At operation 810 of FIG. 8, a zero voltage input is applied to an ADC circuit. Referring to FIG. 2, a zero voltage input can be applied to ADC circuit 130 at sampling switches 142 in place of the input signal from antenna 110.

At operation 820 of FIG. 8, a first register of an estimation circuit accumulates a first offset voltage associated with sampling a positive polarity of an input signal. Referring to FIGS. 2 and 4, first register 230 of estimation circuit 152 accumulates a data stream corresponding to the offset voltage associated with sampling the positive polarity of the input signal. The offset voltage can be caused by a charge injection from first sampling switch 206 and the offset voltage of components of driver circuit 144 and comparator circuit 146.

At operation 830 of FIG. 8, a second register of an estimation circuit accumulates a second offset voltage associated with sampling a negative polarity of the input signal. Referring to FIGS. 2 and 4, second register 232 of estimation circuit 152 accumulates a data stream corresponding to the offset voltage associated with sampling the negative polarity of the input signal. The offset voltage can be caused by a charge injection from second sampling switch 208 and the offset voltage of components of driver circuit 144 and comparator circuit 146.

In some embodiments, sampling switches 142 have a charge injection that accounts for offset voltages associated with first sampling switch 206 and second sampling switch 208. In some embodiments, first sampling switch 206 and second sampling switch 208 each include two switches, electrically connected to the positive and negative nodes of the input signal, respectively. Depending on the number of sampling switches used, the charge injection can vary and be unique to each switch.

To determine the offset voltage, a zero voltage input is applied in place of the input signal to sampling switches 142. First register 230 and second register 232 accumulate data corresponding to the offset voltages associated with sampling the positive and negative polarities of the input signal by sampling switches 142. Referring to FIG. 4, first multiplexer 404, second multiplexer 406, and summation circuit 402 form a feedback loop. The data accumulated from first register 230 and second register 232 while the zero voltage is applied is used in the feedback loop. First multiplexer 404 uses the random binary sequence to determine whether data from first register 230 or second register 232 should be passed forward. Second multiplexer 406 passes the input from first multiplexer to summation circuit 402. The feedback loop allows first register 230 and second register 232 to determine the first offset value associated with sampling the positive polarity and the second offset value associated with sampling the negative polarity as the data from the feedback loop and the digital output from analog circuit 140 are averaged at summation circuit 402. The first offset value and the second offset value each are an average offset voltage, according to some embodiments. The first and second offset value associated with sampling the positive and negative polarities of the input signal are provided to correction circuit 154 to remove the offset from the digital output of the sampled input signal from analog circuit 140 and multiply the digital output from summation circuit 236 by either "+1" or "-1" based on the random binary sequence.

At operation 840 of FIG. 8, a correction circuit receives a first offset value associated with sampling the positive polarity. Referring to FIGS. 2 and 4, first register 230 accumulates data to determine the first offset value associated with sampling the positive polarity of the input signal and provides the corresponding first offset value to multiplexer 234 in correction circuit 154.

At operation 850 of FIG. 8, the correction circuit receives a second offset value associated with sampling the negative polarity. Referring to FIGS. 2 and 4, second register 232 accumulates data to determine the second offset value associated with sampling the negative polarity of the input signal and provides the corresponding second offset value to multiplexer 234 in correction circuit 154.

At operation 860 of FIG. 8, a summation circuit of a correction circuit subtracts either a first offset value or a second offset value from the sampled value of the input signal. Referring to FIG. 2, summation circuit 236 receives either the first offset value or second offset value from multiplexer 234 and the value of the sampled input signal from analog circuit 140. Summation circuit 236 subtracts the offset value from the value of the sampled input signal.

In summary, correction circuit 154 receives a first offset value associated with sampling the positive polarity of the input signal, a second offset voltage associated with sampling the negative polarity of the input signal, a value of the sampled input signal, and a random binary sequence, according to some embodiments. The first offset value and second offset value are determined in operations 820 and 830, respectively. Based on the random binary sequence, from signal generator 120, multiplexer circuit 234 passes the offset value to summation circuit 236. Summation circuit 236 receives the offset value from multiplexer circuit 234 and digital output of the sampled input signal from analog circuit 140. Summation circuit 236 removes the offset value from the digital output received from analog circuit 140. Multiplier circuit 238 multiplies the digital output with the offset removed by either "+1" or "-1" based on the random binary sequence.

Figure 9:
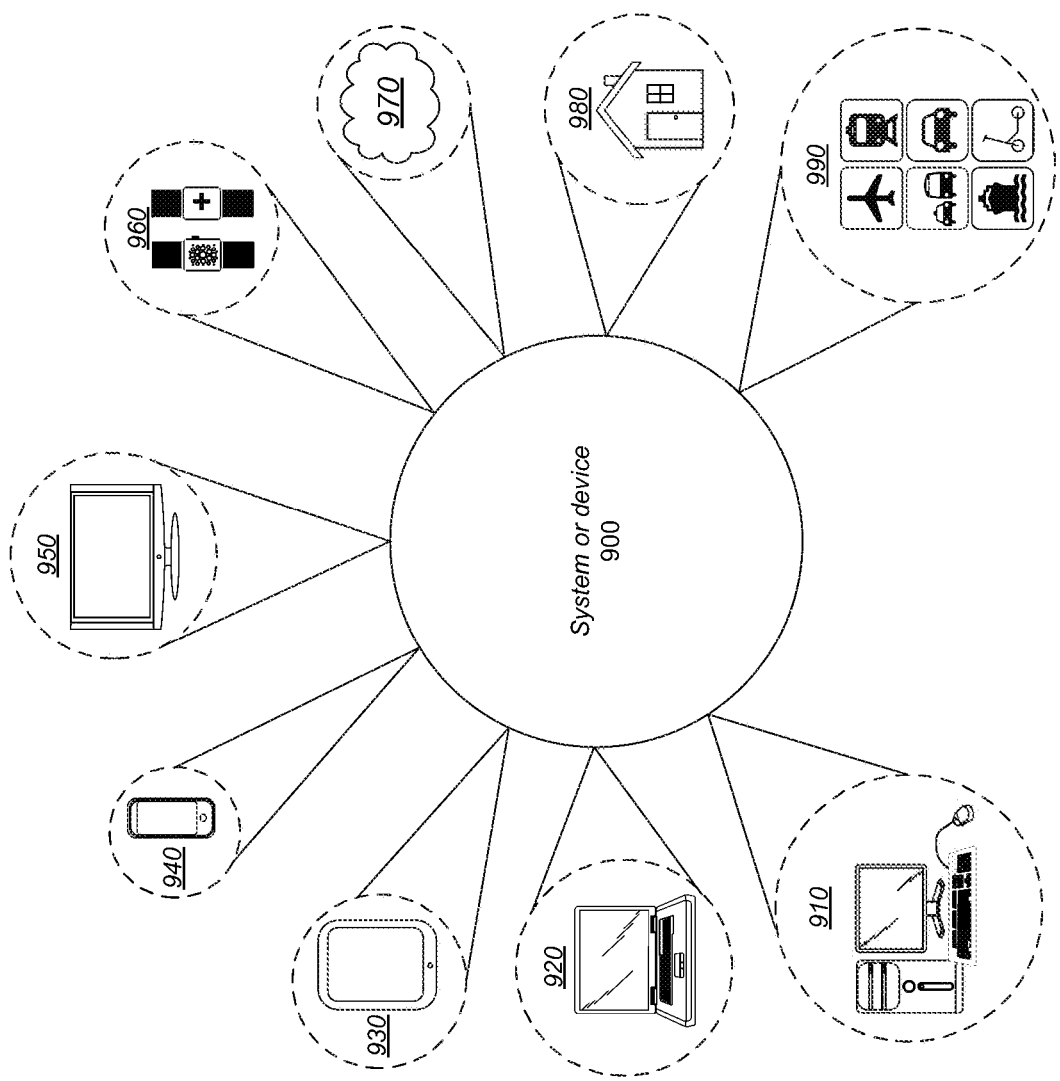
FIG. 9 is an illustration of various exemplary systems or devices that can include the disclosed embodiments.

FIG. 9 is an illustration of exemplary systems or devices that can include the disclosed embodiments. System or device 900 can incorporate one or more of the disclosed embodiments in a wide range of areas. For example, system or device 900 can be implemented in one or more of a desktop computer 910, a laptop computer 920, a tablet computer 930, a cellular or mobile phone 940, and a television 950 (or a set-top box in communication with a television).

Also, system or device 900 can be implemented in a wearable device 960, such as a smartwatch or a health-monitoring device. In some embodiments, the smartwatch can have different functions, such as access to email, cellular service, and calendar functions. Wearable device 960 can also perform health-monitoring functions, such as monitoring a user's vital signs and performing epidemiological functions (e.g., contact tracing and providing communication to an emergency medical service). Wearable device 960 can be worn on a user's neck, implantable in user's body, glasses or a helmet designed to provide computer-generated reality experiences (e.g., augmented and/or virtual reality), any other suitable wearable device, and combinations thereof.

Further, system or device 900 can be implemented in a server computer system, such as a dedicated server or on shared hardware that implements a cloud-based service 970.

System or device 900 can be implemented in other electronic devices, such as a home electronic device 980 that includes a refrigerator, a thermostat, a security camera, and other suitable home electronic devices. The interconnection of such devices can be referred to as the "Internet of Things" (IoT). System or device 900 can also be implemented in various modes of transportation 990, such as part of a vehicle's control system, guidance system, and/or entertainment system.

The systems and devices illustrated in FIG. 9 are merely examples and are not intended to limit future applications of the disclosed embodiments. Other example systems and devices that can implement the disclosed embodiments include portable gaming devices, music players, data storage devices, and unmanned aerial vehicles.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure

What is claimed is:

1. A circuit, comprising:
a signal generator configured to generate a random binary sequence; and
an analog-to-digital converter (ADC) circuit configured to receive an input signal, wherein the ADC circuit comprises:
a first sampling switch configured to sample a positive polarity of the input signal based on the random binary sequence;
a second sampling switch configured to sample a negative polarity of the input signal based on the random binary sequence; and
a comparator circuit configured to generate a digital value based on the sampled positive polarity of the input signal and the sampled negative polarity of the input signal.

2. The circuit of claim 1, wherein the signal generator comprises a zero bias coder configured to receive a binary sequence with an equal number of zeros and ones and to generate a pseudorandom binary sequence based on the binary sequence.

3. The circuit of claim 2, wherein the zero bias coder comprises:
a first plurality of multiplexers configured to receive the binary sequence; and
a second plurality of multiplexers configured to determine an order of the binary sequence.

4. The circuit of claim 1, wherein the ADC circuit further comprises:
a first driver circuit configured to be set to ground prior to the first sampling switch sampling the positive polarity of the input signal;
a first plurality of capacitive elements electrically connected to the first sampling switch and to the first driver circuit;
a second driver circuit configured to be set to ground prior to the second sampling switch sampling the negative polarity of the input signal; and
a second plurality of capacitive elements electrically connected to the second sampling switch and to the second driver circuit.

5. The circuit of claim 4, further comprising:
an estimation circuit, comprising:
a first register configured to receive the random binary sequence and the digital value from the comparator circuit; and
a second register configured to receive the random binary sequence and the digital value from the comparator circuit;
a summation circuit; and
a correction circuit configured to remove an offset from the digital value based on the random binary sequence.

6. A system, comprising:
a signal generator configured to generate a random binary sequence;
a plurality of data converters, wherein each of the plurality of data converters comprises:
a first sampling switch configured to receive a positive polarity of an input signal and the random binary sequence; and
a second sampling switch configured to receive a negative polarity of the input signal and the random binary sequence; and
an aggregator circuit configured to sample the plurality of data converters,
wherein the random binary sequence has a number of bits corresponding to a number of the plurality of data converters.

7. The system of claim 6, wherein each of the plurality of data converters further comprises:
a comparator circuit electrically connected to the first and second sampling switches;
a first driver circuit electrically connected to the comparator circuit;
a first plurality of capacitive elements electrically connected to the first sampling switch and to the first driver circuit;
a second driver circuit electrically connected to the comparator circuit; and
a second plurality of capacitive elements electrically connected to the second sampling switch and to the second driver circuit.

8. The system of claim 7, wherein the first driver circuit and the second driver circuit are configured to be set to ground prior to the first sampling switch and the second sampling switch, respectively, sampling the input signal.

9. The system of claim 7, wherein each of the plurality of data converters further comprises:

an estimation circuit, comprising:
a first register;
a second register; and
a summation circuit; and
a correction circuit electrically connected to the estimation circuit and the comparator circuit.

10. The system of claim 6, wherein the random binary sequence comprises a pseudorandom binary sequence with a zero means.

11. The system of claim 6, further comprising a zero bias coder that includes a first layer of multiplexers and a second layer of multiplexers, wherein:
the first layer of multiplexers is configured to receive a binary sequence from the signal generator; and
the second layer of multiplexers is configured to determine an order of the binary sequence.

12. The system of claim 6, wherein the first sampling switch and the second sampling switch are configured to sample the input signal based on the random binary sequence.

13. The system of claim 6, wherein the aggregator circuit is configured to continuously sample the plurality of data converters at different phases.

14. A method, comprising:
generating, with a signal generator, a random binary sequence;
receiving, with a data converter, the random binary sequence and an input signal;
sampling, with the data converter, a positive polarity of the input signal and a negative polarity of the input signal based on the random binary sequence; and
generating, with a comparator circuit, a digital value based on the sampled positive polarity of the input signal and the sampled negative polarity of the input signal.

15. The method of claim 14, wherein the data converter comprises a first driver circuit, a second driver circuit, a first sampling switch, and a second sampling switch, and wherein the sampling comprises setting the first driver circuit and the second driver circuit to ground prior to the first sampling switch and the second sampling switch, respectively, to sample the positive and negative polarities of the input signal.

16. The method of claim 15, further comprising:
applying a zero voltage input to the data converter;
accumulating, with a first register, an offset associated with the first sampling switch configured to sample the positive polarity of the input signal; and
accumulating, with a second register, an offset associated with the second sampling switch configured to sample negative polarity of the input signal.

17. The method of claim 14, further comprising:
receiving a first offset value associated with sampling the positive polarity;
receiving a second offset value associated with sampling the negative polarity; and
subtracting the first offset value or the second offset value from the digital value.

18. The method of claim 14, wherein generating the random binary sequence comprises generating a pseudorandom binary sequence with a zero means.

19. The method of claim 14, wherein generating the random binary sequence comprises inputting a binary sequence into a zero bias coder comprising:
a first plurality of multiplexers configured to select a first order for the binary sequence; and
a second plurality of multiplexers configured to select a second order for the binary sequence and send the random binary sequence to the data converter.

20. The method of claim 14, further comprising:
connecting a first driver circuit and a second driver circuit to ground prior to sampling the positive polarity of the input signal and the negative polarity of the input signal.

* * * * *